United States Patent [19]

Hartl et al.

[11] Patent Number: 4,718,431
[45] Date of Patent: Jan. 12, 1988

[54] SURFACE COIL WITH CALIBRATION SUBSTANCE FOR USE IN A NUCLEAR MAGNETIC RESONANCE APPARATUS

[75] Inventors: Winfried Hartl, Erlangen; Arnulf Oppelt, Spardorf; Helmut Sturm, Erlangen-Buckenhof, all of Fed. Rep. of Germany

[73] Assignee: Siemens Aktiengesellschaft, Berlin and Munich, Fed. Rep. of Germany

[21] Appl. No.: 914,235

[22] Filed: Oct. 2, 1986

[30] Foreign Application Priority Data

Oct. 22, 1985 [DE] Fed. Rep. of Germany ....... 3537541

[51] Int. Cl.⁴ ................................................. A61B 5/05
[52] U.S. Cl. ..................................... 128/653; 324/308
[58] Field of Search ................. 128/653; 324/308, 321

[56] References Cited

U.S. PATENT DOCUMENTS

| | | |
|---|---|---|
| 3,501,688 | 3/1970 | Nelson . |
| 4,510,450 | 4/1985 | Brown ................. 324/321 |
| 4,528,510 | 7/1985 | Loeffler et al. ........ 324/308 |
| 4,592,363 | 6/1986 | Krause ................. 128/653 |
| 4,635,643 | 1/1987 | Brown ................. 128/653 |

FOREIGN PATENT DOCUMENTS

| | | |
|---|---|---|
| 0096487 | 12/1983 | European Pat. Off. . |
| 0106551 | 4/1984 | European Pat. Off. . |
| 2328472 | 1/1974 | Fed. Rep. of Germany ...... 324/308 |
| 0066346 | 4/1982 | Japan ................................. 324/308 |
| 2043914 | 10/1980 | United Kingdom . |

OTHER PUBLICATIONS

"Mapping of Metabolites in Whole Animals by $^{31}$P NMR Using Surface Coils," Ackerman et al, Nature, vol. 283, Jan. 10, 1980, pp. 167–170.

"Multinuclear NMR Studies of Naturally Occurring Nuclei", Burt et al, J. Nucl. Med. 25, Feb. 1984, pp. 237–248.

"Spatial Localization of Tissue Metabolites by Phosphorus-31 NMR Rotating-Frame Zeugmatography", Garwood et al, J. Mag. Res. 60, (1984), pp. 268–279.

Primary Examiner—Kyle L. Howell
Assistant Examiner—Ruth S. Smith
Attorney, Agent, or Firm—Hill, Van Santen, Steadman & Simpson

[57] ABSTRACT

A coil for conducting examination of a patient in a nuclear magnetic resonance apparatus has a flat surface coil for spectroscopic in vivo examination of the patient and a calibration substance disposed within the coil. The coil is placed in the patient during examination, and the calibration subject supplies a nuclear magnetic resonance signal measurable by the coil as a reference.

3 Claims, 2 Drawing Figures

U.S. Patent   Jan. 12, 1988   4,718,431

SURFACE COIL WITH CALIBRATION SUBSTANCE FOR USE IN A NUCLEAR MAGNETIC RESONANCE APPARATUS

BACKGROUND OF THE INVENTION

1. Field of the Invention

The present invention relates to coils suitable for use in a nuclear magnetic resonance apparatus for undertaking spectroscopic in vivo examinations or a patient.

2. Description of the Prior Art

Surface coils which can be used in rotating frame spectroscopy in a nuclear magnetic resonance apparatus usually generate high-frequency fields which are not homogeneous. Rotating frame spectroscopy with the use of such surface coils is described in "Spatial Localization Of Tissue Metabolites By Phorsphous-31 NMR Rotating-Frame Zeugmatography," Garwood, et al, Journal Of Magnetic Resonance 60, pages 268-279 (1984). As described therein, an examination patient is disposed in a uniform fundamental magnetic field of an NMR system. A surface coil is positioned in the proximity of the region to be examined and, upon the occurrence of a radio-frequency pulse having a specific power and a specific pulse duration $t_1$, the nuclear spins of the examination subject are excited by the resuiting alternating magnetic field. The nuclear magnetic resonance signal emitted by the excited spins is picked up by the surface coil and stored. This procedure is repeated with values of the radio-frequency power varied step-by-step, or values of the pulse duration $t_1$ varied step-by-step.

A two-dimensional Fourier transformation of the measured values is undertaken, which produces a map by which the spectral distribution of the nuclear magnetic resonance signal can be seen dependent on a generalized locus coordinate. The generalized locus coordinate is established by the component of the radio-frequency field strength perpendicular to the direction of the fundamental magnetic field. Thus, a sub-spectrum of the map acquired in this manner shows the spectral distribution of the signal of those spins which are situated on a surface with constant field components (with reference to a plane perpendicular to the fundamental field).

A section showing the field characteristic of a simple surface coil is shown in FIG. 1 of the aforementioned article. Loci which have the same field strength components perpendicular to the fundamental field direction are connected to each other by contour lines.

If the three-dimensional distribution of the set of nuclear spins in question is unknown from the beginning such as, for example, when examining biological specimens or undertaking in vivo examinations, an absolute allocation of the measured spectra to the corresponding surface of constant radio-frequency field strengths is not possible, even when the more precise radio-frequency field distribution of the coil is known, for example, from theoretical calculations or calibration measurements. This is because the damping of the coil by the biological tissue prevents a clear allocation of the radio-frequency pulse of a defined energy to a defined flip angle by which the nuclear spin magnetization is deflected on the surface of constant radio-frequency field strength. The compromise currently employed is to equate the initial appearance of a spectrum with the surface of the patient in representing the spectra as a function of the locus coordinate.

SUMMARY OF THE INVENTION

It is an object or the present invention to provide a surface coil for use in a nuclear magnetic resonance apparatus which permits allocation of the spectra measured from a subject to a surface having a constant radio-frequency field strength component with reference to a plane perpendicular to the fundamental magnetic field.

The above object is achieved in accordance with the principles of the present invention in a surface coil having a calibration substance disposed within the coil. The calibration substance is excited by the applied radio-frequency pulses and emits a nuclear magnetic resonance signal which can be measured by the surfce coil and used as a reference.

As a result, a precise calibration of the flip angle is possible as a function of the pulse power or as a function of the pulse duration in any examination subject. Given the assumption that the characteristic of the radio-frequency distribution of the surface coil does not change due to the examination subject, an allocation of the spectra measured from an object to a particular surface having a constant radio-frequency field strength component at a defined distance from the surface coil is possible. The resonance line or peak corresponding to the calibration substance always appears in the two-dimensional measured spectra, the position of this line or peak enabling the necessary calibration to be made. A further advantage of the coil disclosed herein is that a standard for the chemical shift in the examination subject is always present. If the calibration substance is additionally disposed at a number of different locations at which different amplitudes of the field generated by the radio-frequency coil occur, not only will the aforementioned peak along the locus line be obtained (corresponding to the location of the central point of the substance), but also a line of the calibration substance in all of the other spectra will be obtained. If the calibration substance is a phosphorous-containing material, this additional phosphorous line is extremely useful in undertaking phase correction of in vivo spectra. The calibration substance is permanently integrated within the surface coil and thus further enables a simple checking of the function of the NMR system.

DESCRIPTION OF THE PREFERRED EMBODIMENTS

Figure 1:
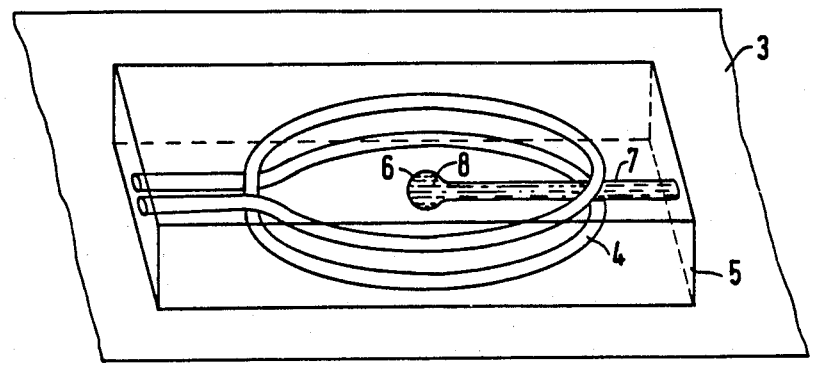
FIG. 1 is a perspective view, partly in section, of a surface coil including a calibration substance constructed in accordance with the principles of the present invention.

A surface coil constructed in accordance with the principles of the present invention is shown in FIG. 1 in position on the surface of an examination subject 3. A surface coil 4 having, for example, two windings is embedded in a carrier material 5. A small round bulb 6 of silica glass communicating with a filling capillary 7 extending to an edge of the carrier material 5 is disposed in the center of the coil 4. The interiors of the bulb 6 and the capillary 7 are filled with a calibration substance 8. The calibration substance 8 may, for example, be methane diphosphoric acid which is particularly suited for phosphorous spectroscopy because, due to the large chemical shift of this substance, the corresponding spectral line usually lies outside of the various in vivo phosphorous spectra. Due to the calibration substance 8 within the capillary 7 in the coil plane, the calibration substance 8 is present in regions having different field strength components perpendicular to the fundamental magnetic field.

Figure 2:
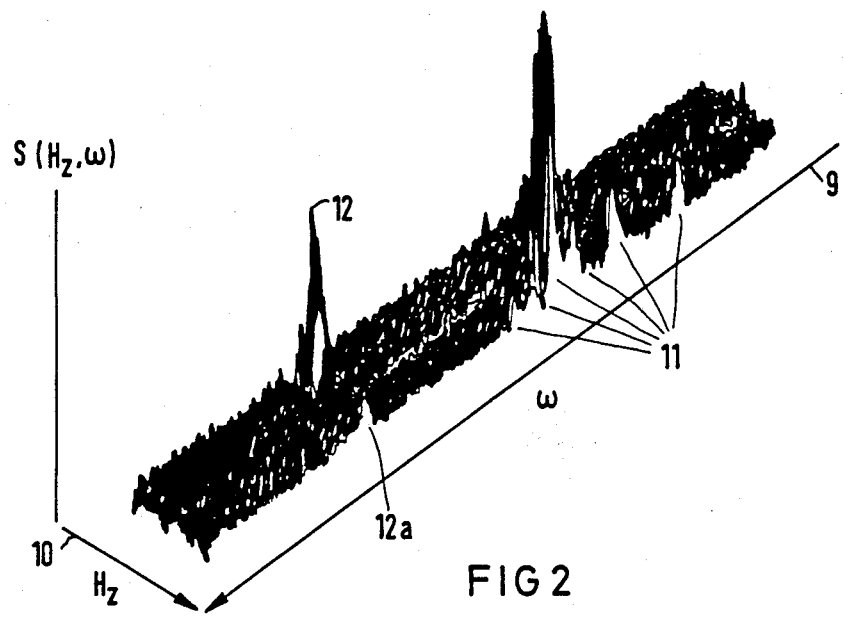
FIG. 2 shows the spectral distributions calculated from tne measured signals obtained from a surface coil as shown in FIG. 1 using rotating frame spectroscopy techniques.

A map produced using signals obtained with the surface coil shown in FIG. 1 is shown in FIG. 2. The signals acquired using the rotating frame method. The spectral distribution S ($\omega$) is shown along the frequency axis 9 on a specific surface having a constant field strength component $H_z$, indicated on axis 10. The resonance line 12 of the calibration substance 8 can be seen at a large distance from the resonance lines 11 of the examination subject 3, so that no disturbing influencing or the spectra of interest occurs. As a result of the position of the calibration specimen resonance line 12 relative to the other lines 11, a measure for the chemical shift of the substances in the examination subject is always available. Because the calibration substance 8 is also disposed in regions of different field strength components $H_z$, the resonance line 12 of the calibration substance is also present in all other spectra, as indicated at 12a.

Although modifications and changes may be suggested by those skilled in the art it is the intention of the inventors to embody within the patent warranted hereon all changes and modifications as reasonably and properly come within the scope of their contribution to the art.

We claim as our invention:

1. A device for use in spectroscopic in vivo examination using a nuclear magnetic resonance apparatus for exciting nuclear magnetic spins in an examination subject and for picking up the resulting resonance signals comprising:
    a carrier block capable of being placed on said examination subject and having a hollow bulb disposed therein and a capillary tube extending from said bulb to an exterior edge of said carrier block;
    a flat radio-freqency coil for exciting said nuclear spins and for receiving said resulting resonance signals, said coil having a center coincident with said bulb; and
    a calibration substance disposed in said bulb and in said capillary tube in said carrier block, said calibration substance consisting of a material excitable by said radio-frequency coil and emitting a resonance signal in response to said excitation measurable by said radio-frequency coil.

2. A device as claimed in claim 1, wherein said calibration substance contains methane diphosphoric acid.

3. A device as claimed in claim 1, wherein said calibration substance is disposed in said carrier block at a plurality of locations at which different amplitudes of the field generated by said radio-frequency coil occur.

* * * * *